United States Patent [19]
Kuo

[11] Patent Number: 5,883,531
[45] Date of Patent: Mar. 16, 1999

[54] UNIVERSAL SERIAL BUS DRIVER HAVING MOS TRANSISTOR GATE CAPACITOR

[75] Inventor: James R. Kuo, Cupertino, Calif.

[73] Assignee: National Semiconductor Corporation, Santa Clara, Calif.

[21] Appl. No.: 912,436

[22] Filed: Aug. 18, 1997

[51] Int. Cl.[6] .......................... H03K 19/017; H03K 17/04
[52] U.S. Cl. .......................... 327/108; 327/391; 327/437; 326/27; 326/83
[58] Field of Search .................................... 327/108, 110, 327/111, 378, 382, 391, 437, 170, 112; 326/22, 23, 24, 26, 27, 17, 62, 68, 82, 83

[56] References Cited

U.S. PATENT DOCUMENTS

| | | | |
|---|---|---|---|
| 4,176,289 | 11/1979 | Leach et al. | 326/88 |
| 4,241,502 | 12/1980 | Lee et al. | 365/203 |
| 4,443,715 | 4/1984 | Fox | 326/88 |
| 4,713,561 | 12/1987 | Yamada | 326/22 |
| 5,262,690 | 11/1993 | Cochran et al. | 327/264 |
| 5,266,847 | 11/1993 | Kuo | 326/18 |
| 5,293,082 | 3/1994 | Bathaee | 327/108 |
| 5,452,333 | 9/1995 | Guo et al. | 375/371 |
| 5,467,464 | 11/1995 | Oprescu et al. | 395/550 |
| 5,489,861 | 2/1996 | Seymour | 327/108 |
| 5,587,678 | 12/1996 | Dijkmans | 327/108 |

Primary Examiner—Timothy P. Callahan
Assistant Examiner—An T. Luu
Attorney, Agent, or Firm—Limbach & Limbach L.L.P.

[57] ABSTRACT

A driver which includes an output node and an output transistor connected between the output node and a first voltage reference node. A CMOS inverter is connected to a gate of the output transistor and includes a first p-channel transistor and a first n-channel transistor that have their gates connected together. A capacitance transistor is connected to the output node and the CMOS inverter and is configured to create a capacitance therebetween. A shifting transistor has its drain-source conducting path connected in series with a drain of the first p-channel transistor and a drain of the first n-channel transistor and is configured to maintain the capacitance transistor in accumulation mode. A method of driving a line includes the steps of creating a capacitance between the output node and the CMOS inverter with a capacitance transistor having its source and drain connected together, and maintaining the capacitance transistor in accumulation mode with a shifting transistor having its drain-source conducting path connected in series with a drain of the first p-channel transistor and a drain of the first n-channel transistor of the CMOS inverter.

33 Claims, 8 Drawing Sheets

UNIVERSAL SERIAL BUS DRIVER HAVING MOS TRANSISTOR GATE CAPACITOR

BACKGROUND OF THE INVENTION

1. Field of the Invention

The present invention relates to bus line drivers, and more particularly, to a driver which meets the specifications for the Universal Serial Bus and that does not utilize linear poly-capacitors.

2. Description of the Related Art

Universal Serial Bus (USB) is a new industry standard for a cable bus that supports data exchange between a host computer and a wide range of simultaneously accessible peripherals. It provides for connection of a personal computer to a telephone line and can be used for port expansion.

The USB standard specifies a differential output driver to drive the data signal onto the USB cable at a data rate of 12 MBS for full speed and 1.5 MBS for low speed. Some of the electrical specifications for the USB standard are sown in Table I. The USB specifications provide challenges to the circuit implementation, especially in CMOS area.

TABLE I

|  | Full Speed (FS) at $C_1$ = 50 pf | | Low Speed (LS) at $C_1$ = 50 to 350 pf | |
| --- | --- | --- | --- | --- |
| Transition | MIN | MAX | MIN | MAX |
| Rise Time (TR) | 4 n | 20 n | 75 n | 300 n |
| Fall Time (TF) | 4 n | 20 n | 75 n | 300 n |
| TR/TF Matching | 90% | 110% | 80% | 120% |
| Diff. Signal Crossing PT | 1.3 V | 2.0 V | 1.3 V | 2.0 V |

The output voltage swings between the two single-ended outputs of a USB driver should be complementary. Furthermore, the output swings between differential high and low should be well balanced, i.e., ±10% matching on a signal transition of 12 ns for full speed and 120 ns for low speed, and have a controlled slew rate in order to minimize signal skew, the radiated noise, cross talk and common mode reflection.

In the low speed switching mode, matching the rise time TR and the fall time TF, i.e., designing the driver so that they are within 20% of each other, is challenging in view of the variations in the load capacitance of the cable. Specifically, a long cable creates a high load capacitance and a short cable creates a low load capacitance, causing the load capacitance in the low speed switching mode to change from 50 pF to 350 pF. The difficulty in matching the rise time TR and the fall time TF is in part due to the high load capacitance of the long cable causing a slow rise time TR, and the low load capacitance of the short cable causing a fast rise time TR.

Thus, there is a need for a USB driver which can closely match the rise time TR and the fall time TF over variations in load capacitance.

SUMMARY OF THE INVENTION

The present invention provides a driver which includes an output node and an output transistor having a conduction path connected between the output node and a first voltage reference node. A shifting transistor has its gate connected to its drain and to a gate of the output transistor. A capacitance transistor is configured to function as a capacitor and is connected between the output node and a source of the shifting transistor. An input n-channel transistor and an input p-channel transistor have their gates connected together and their drains connected in series with a conduction path of the shifting transistor.

The present invention also provides a driver which includes an output node and an output transistor connected between the output node and a first voltage reference node. A CMOS inverter is connected to a gate of the output transistor and includes a first p-channel transistor and a first n-channel transistor that have their gates connected together. A capacitance transistor is connected to the output node and the CMOS inverter and is configured to create a capacitance therebetween. A shifting transistor has its drain-source conducting path connected in series with a drain of the first p-channel transistor and a drain of the first n-channel transistor and is configured to maintain the capacitance transistor in accumulation mode.

The present invention also provides a driver which includes an output node and an output transistor connected between the output node and a first voltage reference node. A CMOS inverter is connected to a gate of the output transistor and includes a first p-channel transistor and a first n-channel transistor that have their gates connected together. A charge storage transistor has a gate connected to a source of the first p-channel transistor to provide an instant charging current thereto by inducing a redistribution of charge from the gate of the charge storage transistor to the gate of the output transistor.

The present invention also provides a method of driving a line. The method includes the steps of: establishing an output node that is connected to the line; establishing an output transistor connected between the output node and a first voltage reference node; driving a gate of the output transistor with a CMOS inverter having a first p-channel transistor and a first n-channel transistor that have their gates connected together; creating a capacitance between the output node and the CMOS inverter with a capacitance transistor having its source and drain connected together; and maintaining the capacitance transistor in accumulation mode with a shifting transistor having its drain-source conducting path connected in series with a drain of the first p-channel transistor and a drain of the first n-channel transistor.

The present invention also provides a method of driving a line. The method includes the steps of: establishing an output node that is connected to the line; establishing an output transistor connected between the output node and a first voltage reference node; driving a gate of the output transistor with a CMOS inverter having a first p-channel transistor and a first n-channel transistor that have their gates connected together; and providing an instant charging current to the gate of the output transistor by inducing a redistribution of charge from a gate of a charge storage transistor having a gate connected to a source of the first p-channel transistor to the gate of the output transistor.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 1:
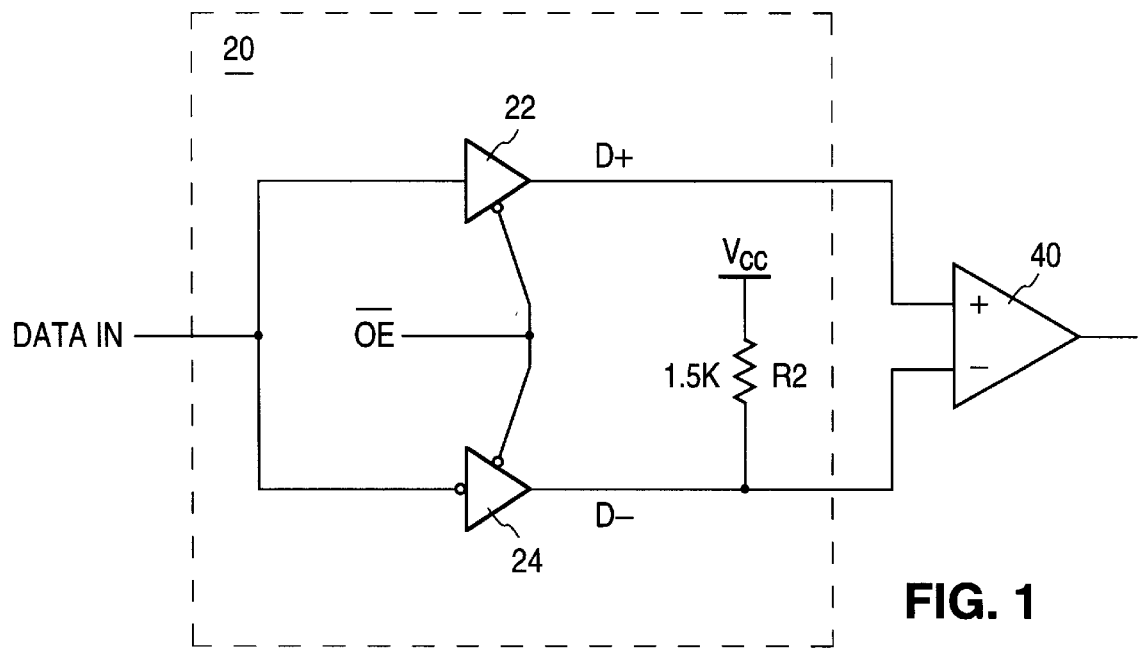
FIG. 1 is a schematic diagram illustrating a driver in accordance with the present invention.

Referring to FIG. 1 there is illustrated a driver 20 in accordance with the present invention. The driver 20 meets or exceeds all of the USB specifications. In particular, the rise time TR and fall time TF of the driver 20 are relatively independent of capacitive loading. This way, the rise time TR and fall time TF are maintained relatively constant with loading which permits the TR/TF matching to be maintained well within the USB specifications.

One advantage of the driver 20 is that it does not use linear poly-capacitors. This is an advantage because the process used to form linear poly-capacitors is expensive. Transceivers which use the driver 20 of the present invention can be integrated into system chips, such as bus controllers, which are implemented in low cost core CMOS processes without using linear poly-capacitors. Edge rate control of the driver 20 is achieved with a MOS transistor gate capacitor. In other words, the driver 20 of the present invention is capable of driving a variable capacitance load bus at a controlled edge rate without using linear poly-capacitors. Instead, the driver 20 utilizes a conventional transistor that is configured to function as a capacitor.

The driver 20 includes two identical single-ended drivers 22 and 24. The output D− of driver 24 is the complement of the output D+ of driver 22. Driver 22's low-to-high transition is well matched to driver 24's high-to-low transition in both slew rate and delay. The driver 20 is shown connected to a differential receiver 40.

Figure 2:
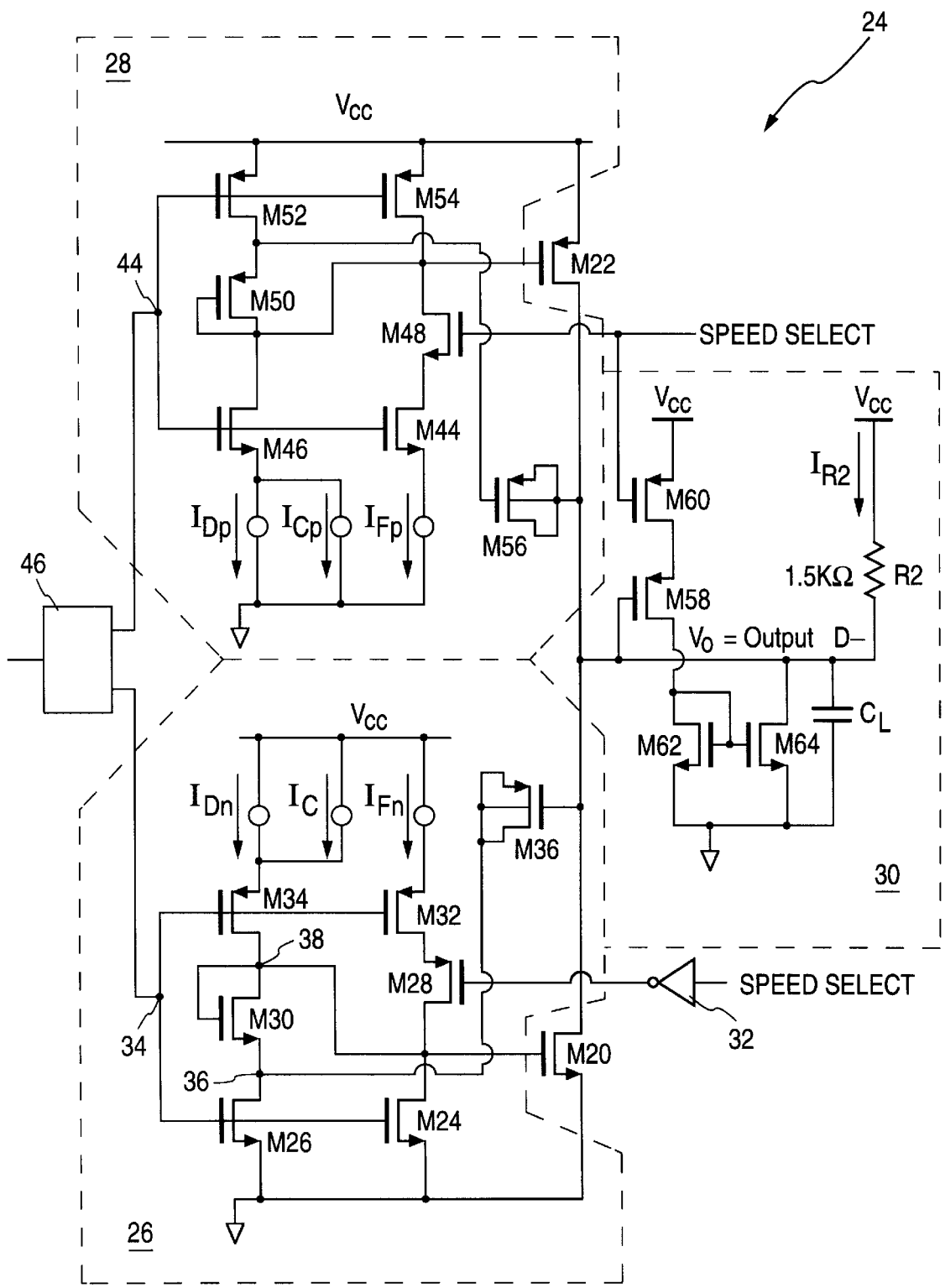
FIG. 2 is a schematic diagram illustrating one of the single ended drivers shown in FIG. 1.

FIG. 2 shows a simplified schematic of driver 24. Driver 24 includes n-channel predrive circuit 26, p-channel predrive circuit 28, output compensation circuit 30 and input circuit 46. The n-channel predrive circuit 26 is used to drive the output n-channel MOS transistor M20, which may be referred to as the low side output transistor, or "LOP". The p-channel predrive circuit 28 is used to drive the output p-channel MOS transistor M22, which may be referred to as the upper side output transistor, or "UOP". In this way, the output NMOS LOP M20 and the output PMOS UOP M22 are driven by separate predrive circuitries. By way of example, transistor M20 may have a channel width of 500 μm and a channel length of 1 μm, and transistor M22 may have a channel width of 1500 μm and a channel length of 1 μm.

The n-channel predrive circuit 26 includes transistors M24, M26, M28, M30, M32, M34 and M36, all connected substantially as shown. By way of example, transistors M24, M26 may each have a channel width of 40 μm and a channel length of 1 μm, transistors M28, M32 may each have a channel width of 100 μm and a channel length of 1 μm, transistor M30 may have a channel width of 160 μm and a channel length of 1 μm, transistor M34 may have a channel width of 80 μm and a channel length of 1 μm, and transistor M36 may have a channel width of 350 μm and a channel length of 4 μm. Additionally, the n-channel predrive circuit 26 includes instant charging current $I_C$, low speed edge-control current $I_{Dn}$ and full speed edge-control current $I_{Fn}$.

In order to select low speed mode (1.5 MBS), the speed select input is pulled low which, because of inverter 32, keeps p-channel transistor M28 turned off which blocks current $I_{Fn}$ from charging the gate of transistor M20. The data input node 34 is the input of a CMOS inverter circuit formed by p-channel transistor M34 and n-channel transistor M26. This CMOS inverter is modified by the connection of transistor M30 in series with the drains of transistors M26, M34. When the data input node 34 of the n-channel predrive circuit 26 is pulled high, n-channel transistors M24, M26 are turned on and p-channel transistor M34 is turned off. Because p-channel transistor M34 is turned off, currents $I_C$ and $I_{Dn}$ are blocked from charging the gate of transistor M20. The gate of output transistor M20 is pulled low by transistors M30, M26, M24 which turns off output transistor M20 and allows the output D− to be pulled high by output transistor M22.

P-channel transistor M36 is used as a Miller capacitor. It is configured to function as a capacitor in that it has its source and drain connected together and to node 36, and its gate is connected to the output node D−. Transistor M36 may be referred to herein as a "capacitance transistor"; however, it should be understood that the word "capacitance" is simply a label used to identify the transistor and is not meant to limit transistor M36 to any particular type of transistor. Transistor M36's gate potential is the same as the potential of output D−. As long as the gate potential of transistor M36 keeps positive with respective to its source/drain potential (i.e., potential of node 36), an accumulated N+ layer is formed on transistor M36. In this scenario, transistor M36 is in accumulation mode. Thus, when the data input node 34 is high, node 36 goes to ground and transistor M36 behaves as a linear capacitor.

When the data input node 34 of the n-channel predrive circuit 26 is pulled low, n-channel transistors M24, M26 are turned off and p-channel transistor M34 is turned on. Because transistor M34 is turned on, currents $I_C$ and $I_{Dn}$ are allowed to charge the gate of transistor M20. However, current $I_{Fn}$ continues to be blocked by transistor M28 being turned off by the speed select input.

Figure 3:
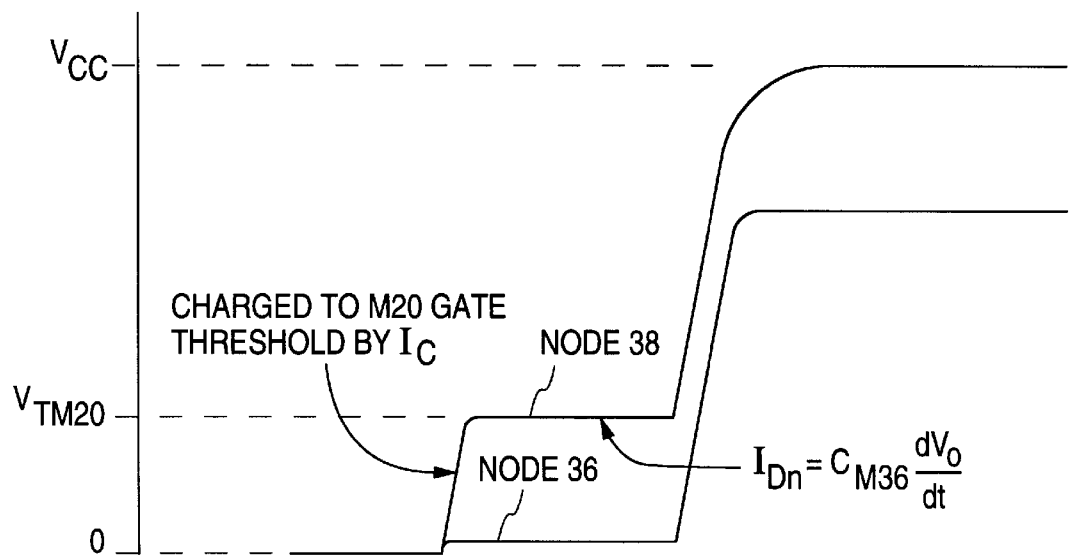
FIG. 3 is a timing diagram illustrating the operation of the n-channel predrive circuit shown in FIG. 2.
Figure 3:
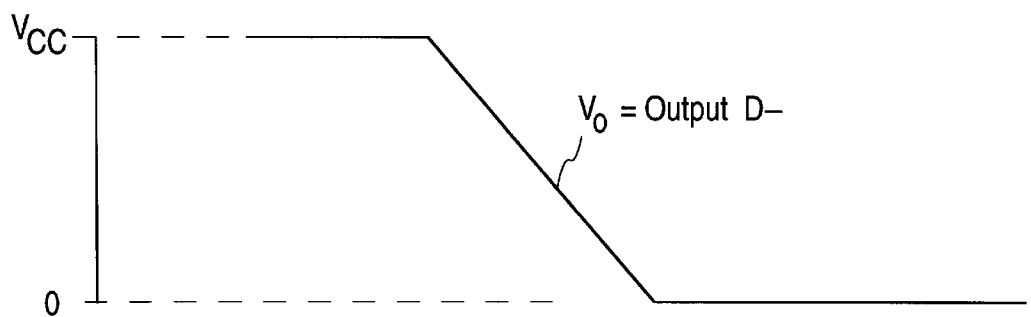

Referring to FIG. 3, the instant charging current $I_C$ is a narrow pulse, high magnitude current which quickly charges node 38 to the gate threshold voltage $V_{TM20}$ of output NMOS transistor M20. The potential of node 38 stays at that level until the output D− reaches ground. Furthermore, n-channel transistor M30 is used to lower, or "shift", the source/drain voltage of transistor M36 by about 1 volt so that node 36 will be near ground potential while input node 34 is low. This "shifting" action of transistor M30 maintains the gate potential of transistor M36 positive with respect to the source/drain potential of transistor M36 in order to maintain transistor M36 in the accumulation mode. Thus, transistor M30 may be referred to herein as a "shifting transistor", but again, the word "shifting" is simply a label and is not meant to limit transistor M30 to any particular type of transistor.

Current $I_{Dn}$, which is used to charge node 36, flows through transistor M36 according to the equation $I_{Dn}=C_{M36}(dVo/dt)$. As shown in FIG. 3, during the fall time TF transition period, the potential of node 36 remains near ground potential which ensures the linearity of the capacitance of transistor M36.

Figure 4:
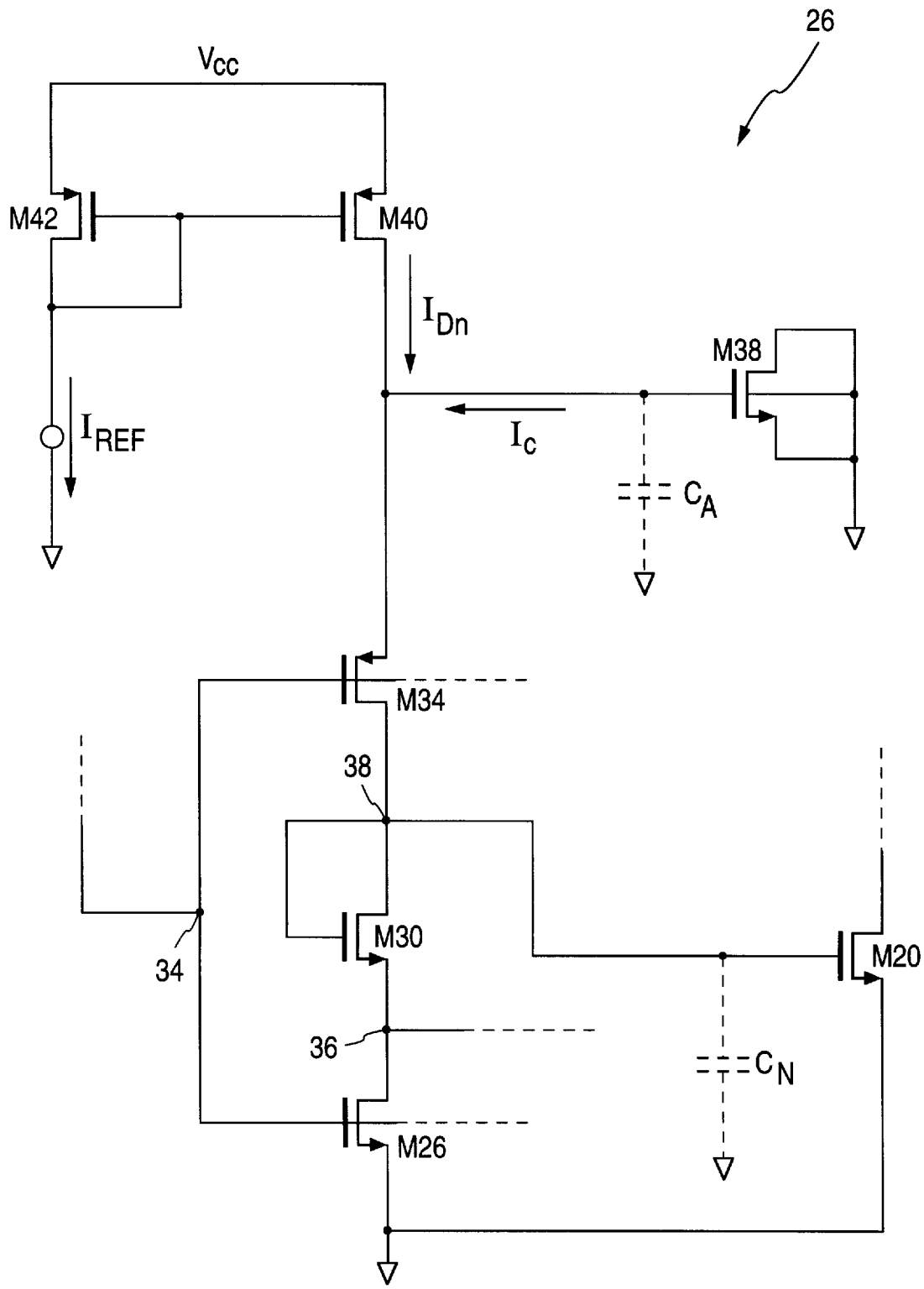
FIG. 4 is a schematic diagram illustrating the generation of the instant charging current $I_C$ and the low speed edge-control current $I_{Dn}$ shown in FIG. 2.

Referring to FIG. 4, an n-channel charge storage transistor M38 is used to generate the high value of the instant charging current $I_C$. With data input node 34 high, transistor M34 is off. The gate of transistor M38 is held at the $V_{CC}$ voltage level and the gate of transistor M20 is at ground level. When the data input node 34 goes low, transistor M34 turns on which forces redistribution of the charge from capacitance $C_A$ to capacitance $C_N$. During this process the gate of transistor M38 instantly goes low with an instant charging current of:

$$I_C = C_A \frac{dV}{dt}$$

The instant charging current $I_C$ charges the capacitance $C_N$ to the threshold voltage level $V_{TM20}$ of transistor M20. By way of example, transistor M38 may have a channel width of 400 μm and a channel length of 4 μm, transistor M40 may have a channel width of 50 μm and a channel length of 2 μm, and transistor M42 may have a channel width of 100 μm and a channel length of 2 μm. Furthermore, it should be understood that the instant discharging current $I_{Cp}$ of the p-channel predrive circuit 28 may be generated in the same general manner as the instant charging current $I_C$.

The n-channel predrive circuit 26 described above performs the single-ended high-to-low transition operation for the driver 24. The single-ended low-to-high transition operation for the driver 24 is performed by the p-channel predrive circuit 28. In general, the low-to-high transition operation is the similar to the high-to-low transition operation and is implemented by replacing the n-channel transistors in 26 with p-channel transistors to form 28.

The p-channel predrive circuit 28 includes transistors M44, M46, M48, M50, M52, M54 and M56, all connected substantially as shown. By way of example, transistors M52, M54 may each have a channel width of 200 μm and a channel length of 1 μm, transistors M44, M48 may each have a channel width of 50 μm and a channel length of 1 μm, transistor M50 may have a channel width of 300 μm and a channel length of 1 μm, transistor M46 may have a channel width of 40 μm and a channel length of 1 μm, and transistor M56 may have a channel width of 350 μm and a channel length of 4 μm. Additionally, the p-channel predrive circuit 28 includes instant discharging current $I_{Cp}$, low speed edge-control current $I_{Dp}$ and full speed edge-control current $I_{Fp}$. The p-channel predrive circuit 28 operates to turn output transistor M22 on and off in a manner similar to the n-channel predrive circuit 26.

The input circuit 46 may include additional drive circuitry for driving the predrive circuits 26, 28, as well as temperature and voltage compensation circuitry. The input circuit 46, however, is an optional part of the present invention.

The output compensation circuit 30 includes transistors M58, M60, M62 and M64 all connected substantially as shown. By way of example, transistors M58, M60 may each have a channel width of 50 μm and a channel length of 1 μm and transistors M62, M64 may each have a channel width of 200 μm and a channel length of 1 μm.

The driver 20 maintains transition time matching between the rise time TR and the fall time TF even during speed signaling, i.e., when a 1.5 KΩ speed signaling terminal resistor is connected to either the D− output terminal or the D+ output terminal (but not both terminals). Matchability in this scenario is difficult due to the unbalanced dc loading current created by the 1.5 KΩ resistor. When a 1.5 KΩ speed signaling resistor is used with the driver 20, it is connected to the D− terminal for slow speed mode and the D+ terminal for full speed mode.

Figure 5:
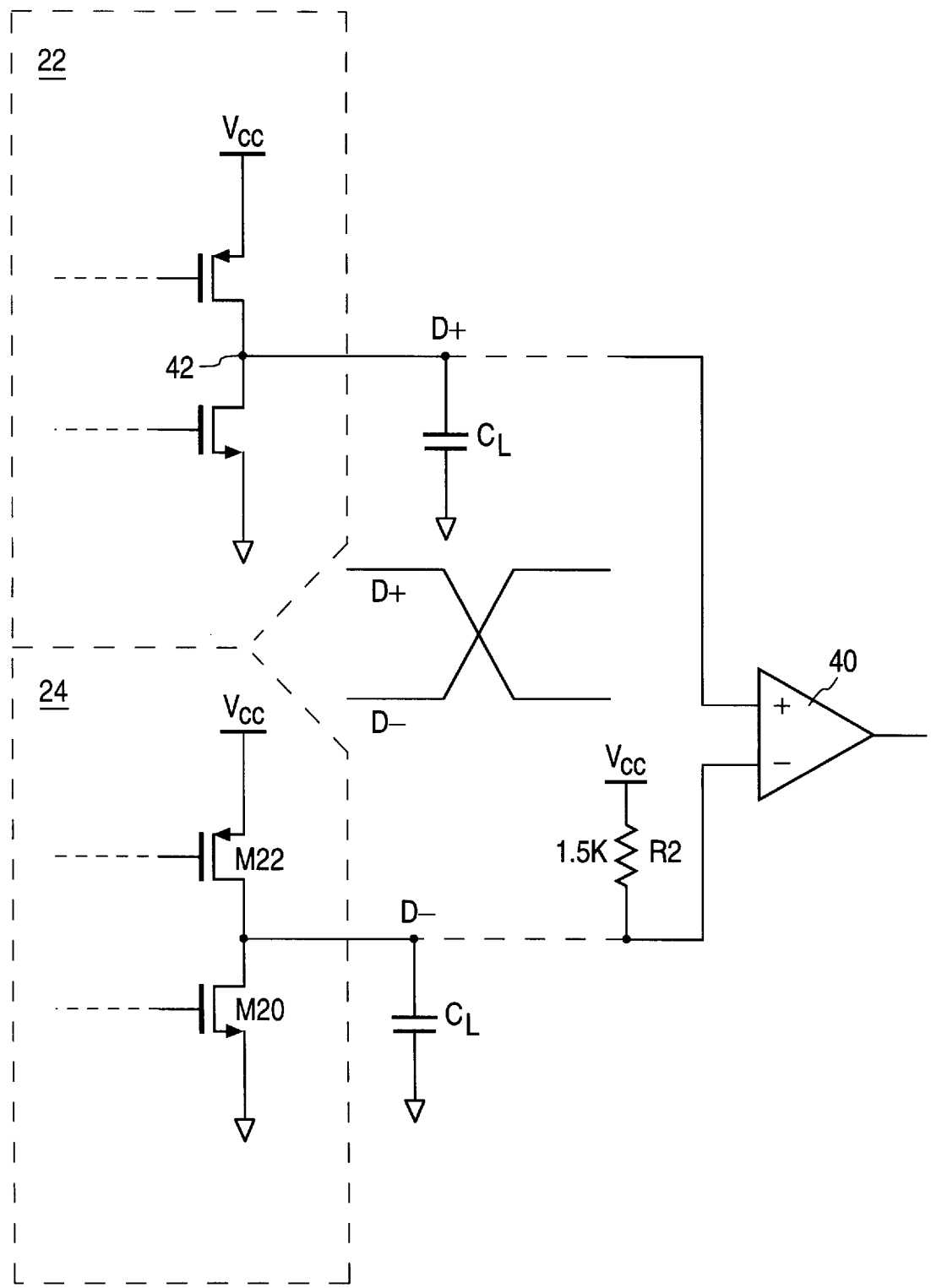
FIG. 5 is a schematic diagram illustrating the operation of a 1.5 KΩ speed signaling resistor with the driver shown in FIG. 1.

FIGS. 1, 2 and 5 show a 1.5 KΩ speed signaling resistor R2 connected to the driver 20's D− terminal for low speed operation. The D+ terminal's high-to-low transition is governed by the Miller capacitors connected to node 42 of the single ended driver 22, i.e., the counterparts of transistors M36, M56 in the single ended driver 24. In contrast, the D− terminal's low-to-high transition is governed by the 1.5 KΩ pull-up resistor R2.

In order to match the fall time TF of driver 22 to the rise time TR of driver 24 the current conducted by resistor R2 is compensated within the driver 24. As shown in FIG. 2, transistor M60 is a switch which is controlled by the speed select input. In the case of low speed mode, the speed select input is pulled low which turns on transistor M60. Transistor M58 behaves as an active resistor that is approximately inverse-linearly proportional to the output D−. When the output D− transitions from low to high, the current conducted by resistor R2 is equal to:

$$I_{R2} = (V_{CC} - V_O)/1.5 \text{ KΩ}$$

The current $I_{R2}$ is absorbed by transistor M64. Transistor M64 may be referred to herein as an "current absorbing transistor", but the word "absorbing" is not intended to limit transistor M64 to any particular type of transistor. Transistor M58 controls the current conducted by transistor M64. Transistor M58 has its gate connected to the output node D− and, along with current mirror transistor M62, is configured to conduct a current that is proportional to the dc loading current to be absorbed. Thus, with current $I_{R2}$ absorbed by transistor M64, the rising transition of the D− terminal is governed by the Miller capacitors M36, M56 and can closely match the falling transition of the D+ terminal.

The unique edge rate compensation scheme of the output circuit 30 can be used in any TTL output to drive large capacitive loads (such as memory address drivers) with controlled edge rates and without performance degradation. Without such compensation, a conventional TTL driver's output transition will be badly distorted when encountering large capacitive loads.

In order to operate the driver 20 in full speed mode (12 MBS), the speed select input is pulled high. This turns on transistor M28, due to inverter 32, to allow conduction of the full speed edge-control current $I_{Fn}$. Full speed mode is implemented by adding the current $I_{Fn}$ to the current $I_{Dn}$ to increase the rate at which the gate of transistor M20 is charged. Additionally, pulling the speed select input high turns on transistor M48 which allows conduction of the full speed edge-control current $I_{Fp}$. The current $I_{Fp}$ is added to the current $I_{Dp}$ to increase the rate at which the gate of transistor M22 is discharged.

The falling edge slew rate of the driver 20 is equal to:

$$dV_{OF}/dt_F = C_{M36}/I_{Dn}$$

The rising edge slew rate of the driver 20 is equal to:

$$dV_{OR}/dt_R = C_{M56}/I_{Dp}$$

The rise time $t_R$ and fall time $t_F$ can be matched within ±10% tolerance because the currents $I_{Dn} = I_{Dp}$ and $I_{Fn} = I_{Fp}$ can be easily matched by using current mirrors and careful transistor channel length and width selection. Thus:

$$dV_{OF}/dt_F = dV_{OR}/dt_R = C_{M36}/I_{Dn} = C_{M56}/I_{Dp}$$

Figure 6A:
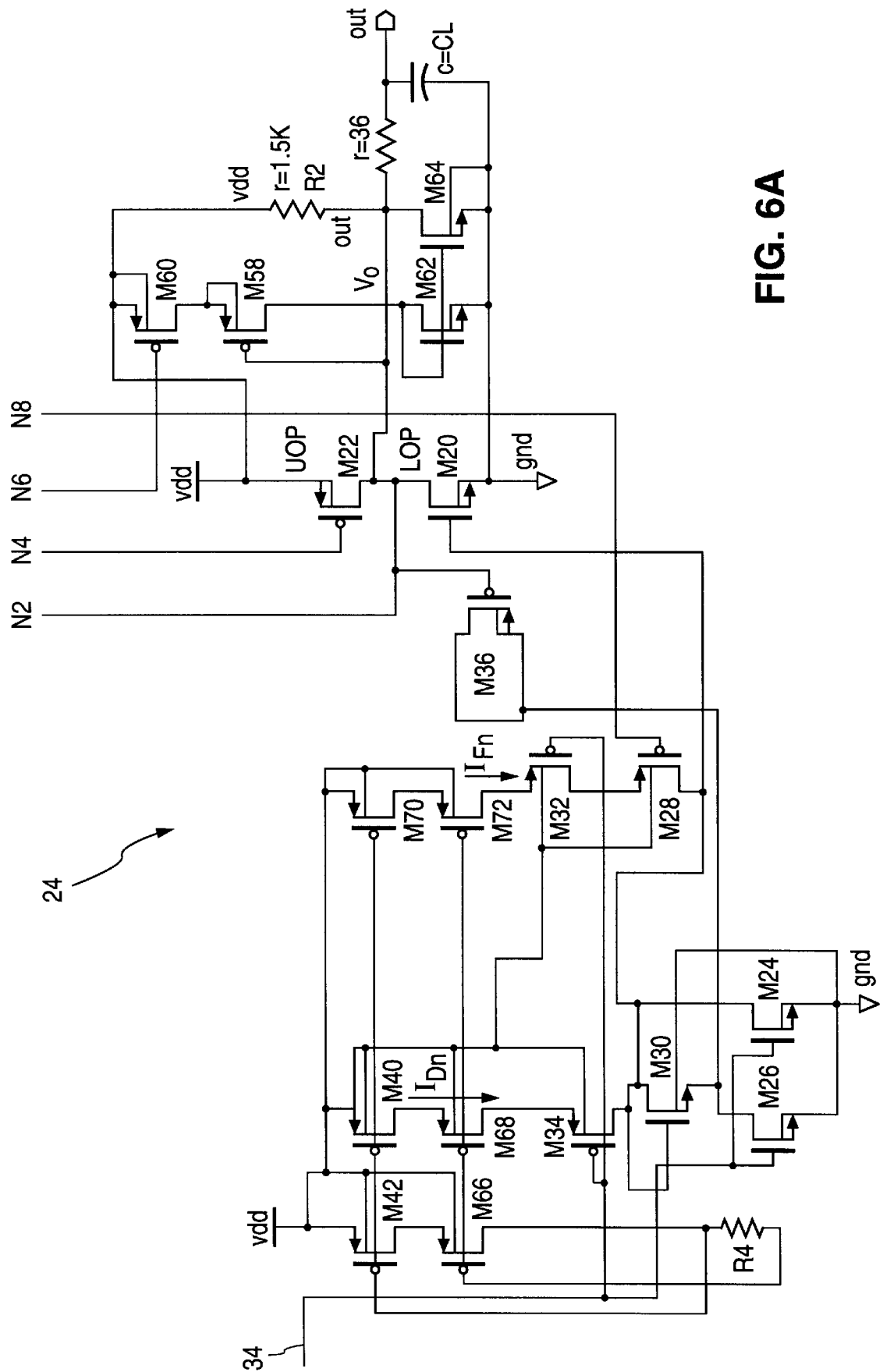
FIGS. 6A and 6B are detailed schematic diagrams illustrating the single ended driver shown in FIG. 2.
Figure 6B:
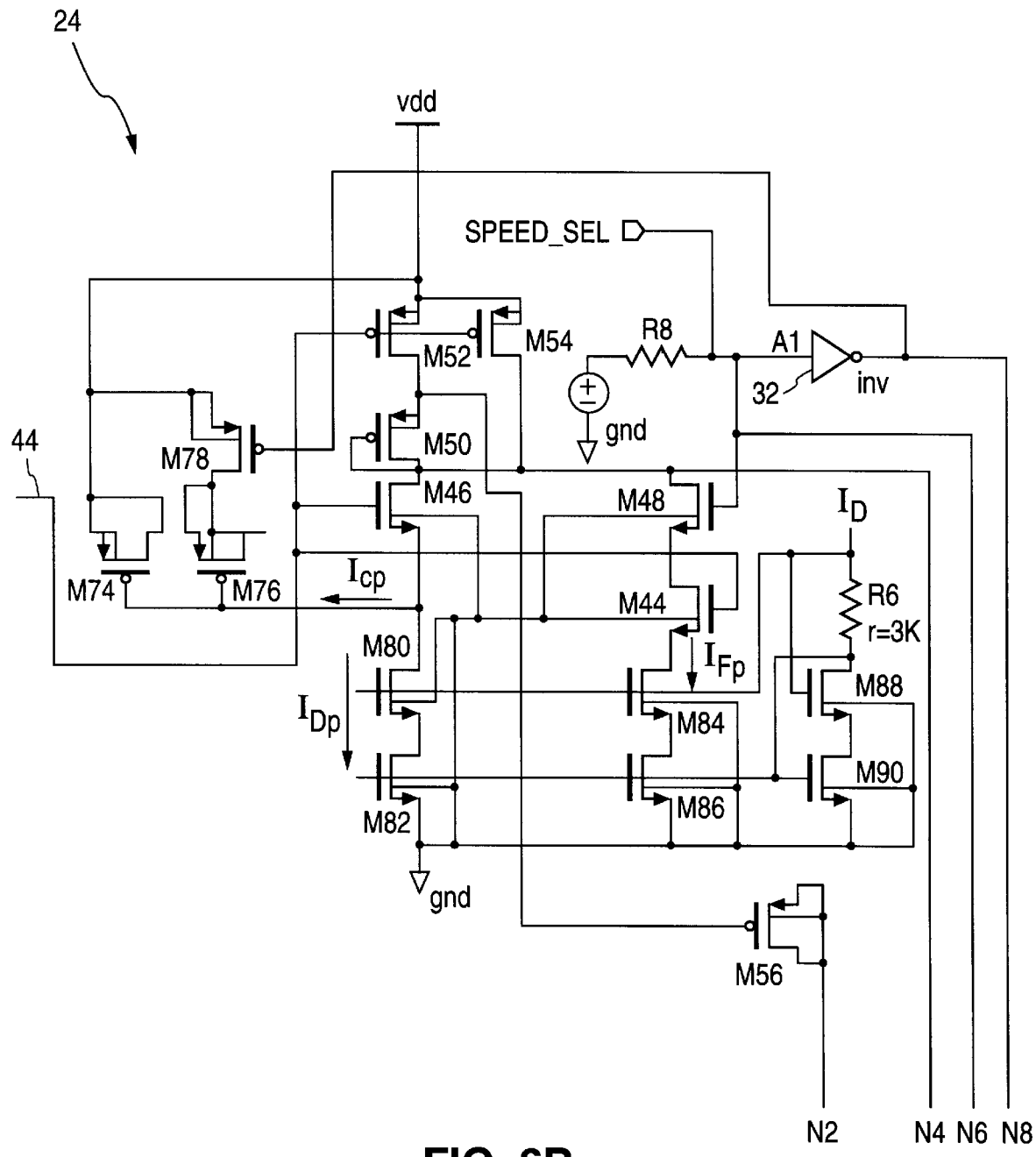

FIGS. 6A and 6B show a detailed schematic of the driver 24. By way of example, transistors M40, M68 may each have a channel width of 50 μm and a channel length of 2 μm, transistors M42, M66 may each have a channel width of 100 μm and a channel length of 2 μm, transistors M70, M72 may each have a channel width of 320 μm and a channel length of 2 μm, transistors M74, M76 may each have a channel width of 70 μm and a channel length of 6 μm, transistor M78 may have a channel width of 40 μm and a channel length of 1 μm, transistors M80, M82 may each have a channel width of 60 μm and a channel length of 1.5 μm, transistors M84, M86 may each have a channel width of 370 μm and a channel length of 1.5 μm, transistors M88, M90 may each have a channel width of 100 μm and a channel length of 1.5 μm, and resistors R4, R6 may each have a value of 3 KΩ.

Figure 7:
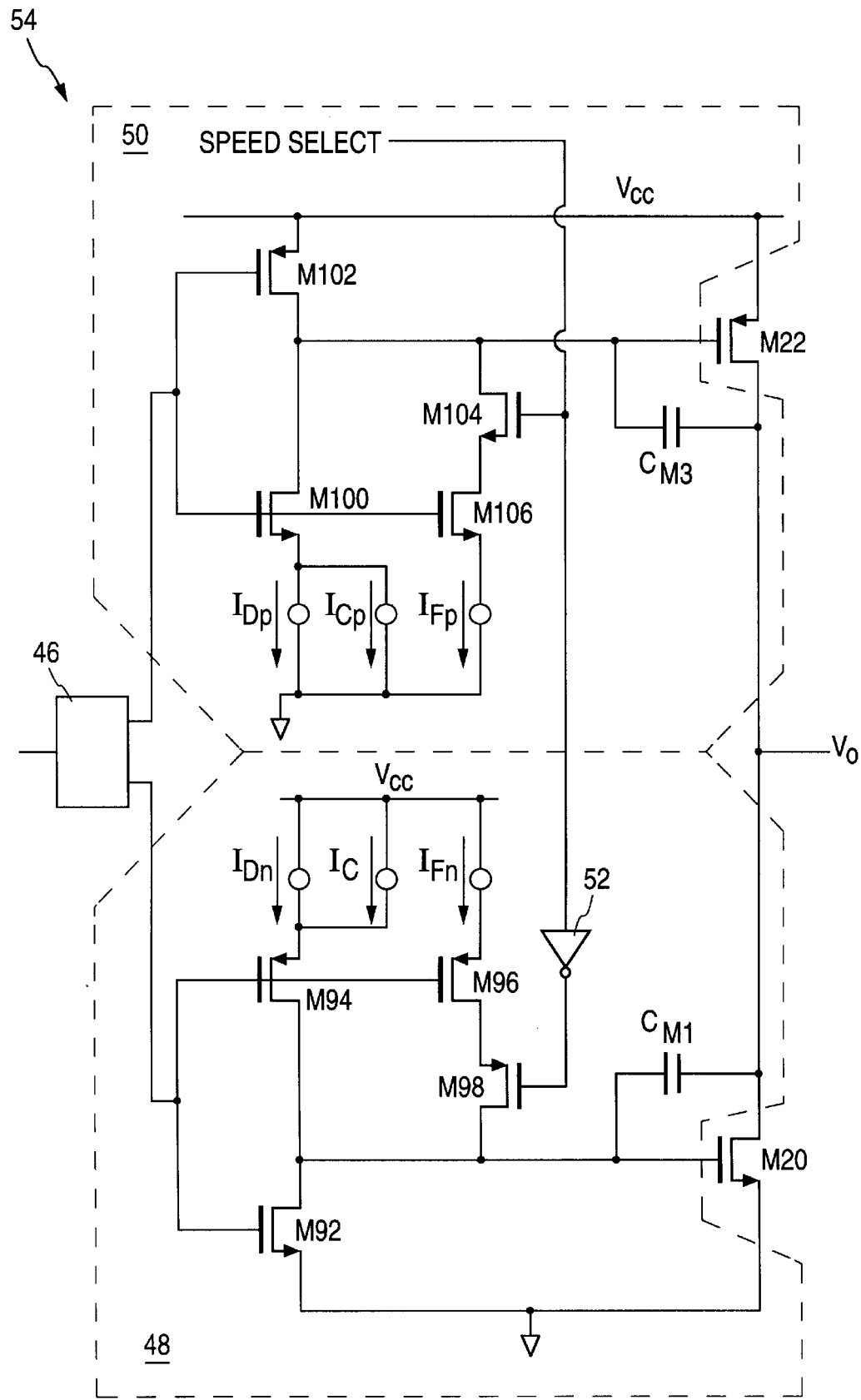
FIG. 7 is a schematic diagram illustrating another single ended driver which may be used in the circuit shown in FIG. 1.
Figure 8:
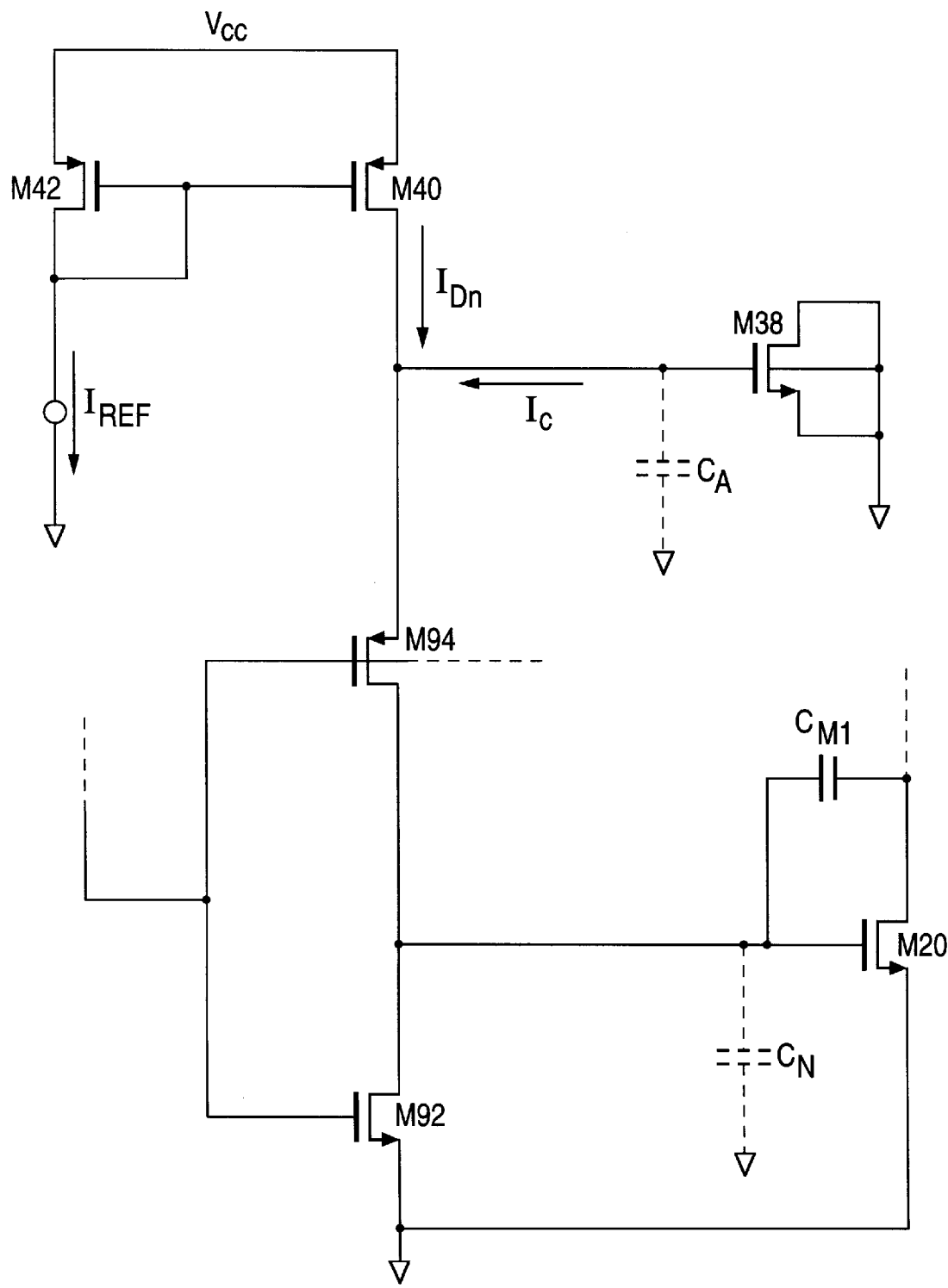
FIG. 8 is a schematic diagram illustrating the generation of the instant charging current $I_C$ and the low speed edge-control current $I_{Dn}$ shown in FIG. 7.

As mentioned above, one advantage of the single-ended drivers 22 and 24 is that they do not utilize linear poly-capacitors. It should be noted, however, that the circuit shown in FIG. 4 may also be used to generate the instant charging current $I_C$ for single-ended drivers which do utilize linear poly-capacitors. Referring to FIG. 7, the single-ended driver 54 includes n-channel predrive circuit 48 and p-channel predrive circuit 50. Furthermore, the Miller poly-capacitors CM1 and CM3 are connected between the drain and gate of output transistors M20 and M22, respectively. The Miller poly-capacitors CM1, CM3 are used instead of the capacitance transistors M36, M56 and shifting transistors M30, M50 which are included in the single-ended driver 24. Referring to FIG. 8, the n-channel charge storage transistor M38 is used to generate the high value of the instant charging current $I_C$ for the n-channel predrive circuit 48 in the same manner as described above with respect to FIG. 4.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A driver, comprising:
   an output node;
   an output transistor having a conduction path connected between the output node and a first voltage reference node;
   a shifting transistor having its gate connected to its drain and to a gate of the output transistor;
   a capacitance transistor configured to function as a capacitor and connected between the output node and a source of the shifting transistor; and
   an input n-channel transistor and an input p-channel transistor which have their gates connected together and their drains connected in series with a conduction path of the shifting transistor.

2. A driver according to claim 1, wherein the output transistor comprises an n-channel transistor, the shifting transistor comprises an n-channel transistor, and the capacitance transistor comprises a p-channel transistor having a gate connected to the output node and a source and drain connected to the source of the shifting transistor.

3. A driver according to claim 1, wherein the output transistor comprises a p-channel transistor, the shifting transistor comprises a p-channel transistor, and the capacitance transistor comprises a p-channel transistor having a source and drain connected to the output node and a gate connected to the source of the shifting transistor.

4. A driver according to claim 1, further comprising:
   a current absorbing transistor connected between the output node and ground; and
   a control circuit coupled to the output node and the current absorbing transistor and configured to turn the current absorbing transistor on to absorb a dc loading current in the output node.

5. A driver according to claim 4, wherein the control circuit comprises:
   a current mirror transistor having a source connected to ground and a gate connected to a gate of the current absorbing transistor; and
   a control transistor having a gate connected to the output node, a drain connected to a drain of the current mirror transistor, and a source coupled to a voltage supply node.

6. A driver, comprising:
   an output node;
   an output transistor connected between the output node and a first voltage reference node;
   a CMOS inverter connected to a gate of the output transistor and having a first p-channel transistor and a first n-channel transistor that have their gates connected together;
   a capacitance transistor connected to the output node and the CMOS inverter and configured to create a capacitance therebetween; and
   a shifting transistor having its drain-source conducting path connected in series with a drain of the first p-channel transistor and a drain of the first n-channel transistor and configured to maintain the capacitance transistor in accumulation mode.

7. A driver according to claim 6, wherein the capacitance transistor comprises:
   a second p-channel transistor having a gate connected to the output node and having a source and drain connected together and to the drain of the first n-channel transistor.

8. A driver according to claim 6, wherein the shifting transistor has a gate that is connected to its drain in order to maintain a potential of a gate of the capacitance transistor positive with respect to a potential of its source and drain in order to maintain the capacitance transistor in accumulation mode.

9. A driver according to claim 6, further comprising:
   a current absorbing transistor connected between the output node and ground and configured to absorb a dc loading current in the output node.

10. A driver according to claim 9, further comprising:
    a control transistor having a gate connected to the output node and configured to conduct a current that is proportional to the dc loading current to be absorbed.

11. A driver, comprising:
    an output node;
    an output transistor connected between the output node and a first voltage reference node;
    a CMOS inverter connected to a gate of the output transistor and having a first p-channel transistor and a first n-channel transistor that have their gates connected together; and
    a charge storage transistor having a gate connected to a source of the first p-channel transistor to provide an instant charging current thereto by inducing a redistribution of charge from the gate of the charge storage transistor to the gate of the output transistor.

12. A driver according to claim 11, wherein the charge storage transistor has its drain and source connected together.

13. A driver according to claim 11, wherein the charge storage transistor comprises an n-channel transistor having its drain and source connected to ground.

14. A driver according to claim 11, further comprising:

a capacitance transistor connected to the output node and the CMOS inverter and configured to create a capacitance therebetween.

15. A driver according to claim 14, further comprising:

a shifting transistor having its drain-source conducting path connected in series with a drain of the first p-channel transistor and a drain of the first n-channel transistor and configured to maintain the capacitance transistor in accumulation mode.

16. A driver according to claim 11, wherein the first p-channel and first n-channel transistors have their drains connected together and to the gate of the output transistor.

17. A driver according to claim 11, further comprising:

a poly-capacitor connected between the gate and a drain of the output transistor.

18. A method of driving a line, comprising the steps of:

establishing an output node that is connected to the line;

establishing an output transistor connected between the output node and a first voltage reference node;

driving a gate of the output transistor with a CMOS inverter having a first p-channel transistor and a first n-channel transistor that have their gates connected together;

creating a capacitance between the output node and the CMOS inverter with a capacitance transistor having its source and drain connected together; and maintaining the capacitance transistor in accumulation mode with a shifting transistor having its drain-source conducting path connected in series with a drain of the first p-channel transistor and a drain of the first n-channel transistor.

19. A method according to claim 18, wherein the step of creating a capacitance comprises the steps of:

connecting a gate of the capacitance transistor to the output node; and connecting the source and drain of the capacitance transistor to the drain of the first n-channel transistor.

20. A method according to claim 18, wherein the step of maintaining the capacitance transistor in accumulation mode comprises the steps of:

connecting a gate of the shifting transistor to a drain of the shifting transistor; and maintaining a gate potential of the capacitance transistor positive with respect to a source and drain potential of the capacitance transistor.

21. A method according to claim 18, further comprising the step of:

absorbing a dc loading current in the output node with a second n-channel transistor connected between the output node and ground.

22. A method of driving a line, comprising the steps of:

establishing an output node that is connected to the line;

establishing an output transistor connected between the output node and a first voltage reference node;

driving a gate of the output transistor with a CMOS inverter having a first p-channel transistor and a first n-channel transistor that have their gates connected together;

creating a capacitance between the output node and the CMOS inverter with a second p-channel transistor having its source and drain connected together; and maintaining a gate potential of the second p-channel transistor positive with respect to its source and drain potential with a shifting transistor having its drain-source conducting path connected in series with a drain of the first p-channel transistor and a drain of the first n-channel transistor.

23. A method according to claim 22, wherein the step of creating a capacitance comprises the steps of:

connecting a gate of the second p-channel transistor to the output node; and connecting the source and drain of the second p-channel transistor to the drain of the first n-channel transistor.

24. A method according to claim 22, wherein the step of maintaining a gate potential of the second p-channel transistor comprises the steps of:

connecting a gate of the shifting transistor to a drain of the shifting transistor;

connecting the drain of the shifting transistor to the drain of the first p-channel transistor; and connecting the source of the shifting transistor to the drain of the first n-channel transistor.

25. A method according to claim 22, further comprising the step of:

absorbing a dc loading current in the output node with a second n-channel transistor connected between the output node and ground.

26. A method of driving a line, comprising the steps of:

establishing an output node that is connected to the line;

establishing an output n-channel transistor connected to the output node and configured to discharge the output node;

establishing an input CMOS inverter having a first p-channel transistor and a first n-channel transistor that have their gates connected together;

driving a gate of the output n-channel transistor with a drain of the first p-channel transistor;

creating a capacitance between the output node and a drain of the first n-channel transistor with a second p-channel transistor having its source and drain connected together; and lowering a voltage potential of the source and drain of the second p-channel transistor with a shifting transistor having its drain-source conducting path connected in series with the drains of the first p-channel transistor and the first n-channel transistor.

27. A method according to claim 26, wherein the step of creating a capacitance comprises the steps of:

connecting a gate of the second p-channel transistor to the output node; and connecting the source and drain of the second p-channel transistor to the drain of the first n-channel transistor.

28. A method according to claim 26, wherein the step of lowering a voltage potential comprises the step of:

connecting a gate of the shifting transistor to a drain of the shifting transistor.

29. A method according to claim 26, further comprising the step of:

absorbing a dc loading current in the output node with a second n-channel transistor connected between the output node and ground.

30. A method according to claim 29, further comprising the step of:

controlling a gate voltage of the second n-channel transistor with a third p-channel transistor having its gate connected to the output node and configured to conduct a current that is proportional to the dc loading current to be absorbed.

31. A method of driving a line, comprising the steps of:

establishing an output node that is connected to the line;

establishing an output transistor connected between the output node and a first voltage reference node;

driving a gate of the output transistor with a CMOS inverter having a first p-channel transistor and a first n-channel transistor that have their gates connected together;

creating a capacitance between the output node and the CMOS inverter with a capacitance transistor having its source and drain connected together;

maintaining the capacitance transistor in accumulation mode with a shifting transistor having its drain-source conducting path connected in series with a drain of the first p-channel transistor and a drain of the first n-channel transistor; and providing an instant charging current to the gate of the output transistor by inducing a redistribution of charge from a gate of a charge storage transistor having a gate connected to a source of the first p-channel transistor to the gate of the output transistor.

32. A method according to claim 31, wherein the charge storage transistor comprises an n-channel transistor having its drain and source connected to ground.

33. A method according to claim 31, further comprising the step of:

creating a capacitance between the gate and a drain of the output transistor by connecting a poly-capacitor therebetween.

* * * * *